(12) United States Patent
Matsuya et al.

(10) Patent No.: US 6,852,983 B2
(45) Date of Patent: Feb. 8, 2005

(54) CHARGED-PARTICLE BEAM APPARATUS EQUIPPED WITH ABERRATION CORRECTOR

(75) Inventors: Miyuki Matsuya, Tokyo (JP); Hiroyoshi Kazumori, Tokyo (JP)

(73) Assignee: JEOL Ltd., Tokyo (JP)

( * ) Notice: Subject to any disclaimer, the term of this patent is extended or adjusted under 35 U.S.C. 154(b) by 94 days.

(21) Appl. No.: 10/300,670

(22) Filed: Nov. 20, 2002

(65) Prior Publication Data

US 2003/0122076 A1 Jul. 3, 2003

(30) Foreign Application Priority Data

Nov. 20, 2001 (JP) ........................................ 2001-354335

(51) Int. Cl.[7] ................................................ G21K 1/08
(52) U.S. Cl. ............................. 250/396 ML; 250/396 R
(58) Field of Search ...................... 250/396 R, 396 ML (56) References Cited

U.S. PATENT DOCUMENTS

| | | | |
|---|---|---|---|
| 4,588,891 A | | 5/1986 | Saito |
| 5,134,289 A | | 7/1992 | Murakoshi et al. |
| 5,291,016 A | * | 3/1994 | Taya ........................ 250/292 |
| 5,477,049 A | | 12/1995 | Kitamura |
| 5,552,602 A | | 9/1996 | Kakibayashi et al. |
| 5,578,821 A | | 11/1996 | Meisberger et al. |
| 5,866,905 A | | 2/1999 | Kakibayashi et al. |
| 6,426,501 B1 | | 7/2002 | Nakagawa |
| 6,432,594 B1 | * | 8/2002 | Kamijo ........................ 430/30 |
| 6,525,328 B1 | * | 2/2003 | Miyoshi et al. ......... 250/492.22 |
| 2003/0098415 A1 | * | 5/2003 | Matsuya et al. ............ 250/306 |
| 2004/0036030 A1 | * | 2/2004 | Matsuya et al. ........ 250/396 R |

FOREIGN PATENT DOCUMENTS

| | | |
|---|---|---|
| JP | 62-16160 | 2/1977 |
| JP | 57-36763 | 2/1982 |
| JP | 01 159943 | 6/1989 |
| JP | 01 236563 | 9/1989 |
| JP | 05062629 | 3/1993 |

OTHER PUBLICATIONS

H. Rose, *Optik* 33, Heft 1, pp. 1–24 (1971).
"Design and test of an electric and magnetic dodecapole lens", of M. Haider et al., *Optik* 63, No. 1 (1982), pp. 9–23.
"Design of a high–resolution low–voltage scanning electron microscope", J. Zach, *Optik* 83, No. 1 (1989), pp. 30–40.
"Aberration correction in a low voltage SEM by a multipole corrector", J. Zach et al., *Nucl. Instr. and Meth. in Phys. Res. A 363* (1995), pp. 316–325.

* cited by examiner

*Primary Examiner*—Jack Berman
*Assistant Examiner*—Kalimah Fernandez
(74) *Attorney, Agent, or Firm*—Webb Ziesenheim Logsdon Orkin & Hanson, P.C.

(57) ABSTRACT

Particle-beam apparatus is realized which is equipped with an aberration corrector capable of controlling the angular aperture of a particle beam after performing aberration correction. The corrector comprises four stages of electrostatic quadrupole elements, two stages of magnetic quadrupole elements for superimposing a magnetic potential distribution analogous to the electric potential distribution created by the two central stages of the electrostatic quadrupole elements, and four stages of electrostatic octupole elements for superimposing an octupole electric potential on the electric potential distribution created by the four stages of electrostatic quadrupole elements. An objective lens is located downstream of the corrector. An objective aperture is located upstream of the corrector. An angular aperture control lens is located downstream of the objective aperture to control the angular aperture of the probe hitting a specimen surface.

12 Claims, 8 Drawing Sheets

CHARGED-PARTICLE BEAM APPARATUS EQUIPPED WITH ABERRATION CORRECTOR

BACKGROUND OF THE INVENTION

1. Field of the Invention

The present invention relates to an aberration corrector for use in an instrument using an electron beam or ion beam (such as a scanning electron microscope or ion microprobe). The charged-particle beam is adjusted by optics to correct chromatic and spherical aberrations.

2. Description of Related Art

In a scanning electron microscope or transmission electron microscope, an aberration corrector is incorporated in the optics in order to provide high-resolution imaging or to enhance the probe current density. One proposed example of this aberration corrector uses a combination of electrostatic quadrupole elements and magnetic quadrupole elements to correct chromatic aberration. The corrector also uses four stages of octupole elements to correct spherical aberration. The principle is introduced in detail in various literature: [1] H. Rose, *Optik* 33, Heft 1, 1–24 (1971); [2] J. Zach, *Optik* 83, No. 1, 30–40 (1989); and [3] J. Zach and M. Haider, *Nucl. Instru. and Meth. In Phys. Res.* A 363, 316–325 (1995).

Figure 1:
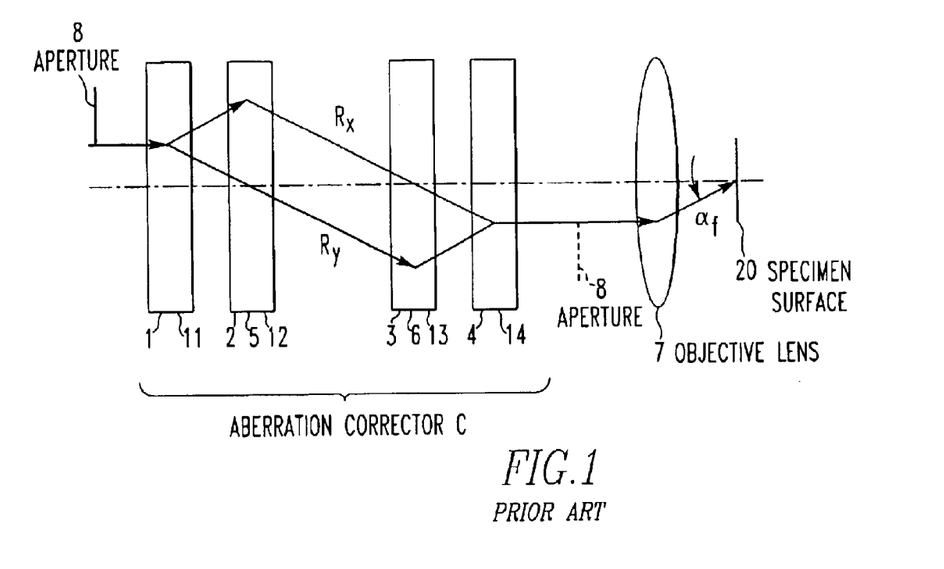
FIG. 1 is a diagram illustrating the principle of an aberration corrector.

The principle of the above-described aberration corrector is described briefly now by referring to FIG. 1, where an aberration corrector C is placed ahead of an objective lens 7. The aberration corrector C comprises four stages of electrostatic quadrupole elements 1, 2, 3, 4, two stages of magnetic quadrupole elements 5, 6, and four stages of electrostatic octupole elements 11, 12, 13, 14. The two stages of magnetic quadrupole elements 5, 6 create a magnetic potential distribution analogous to the electric potential distribution created by the second and third stages of the electrostatic quadrupole elements to produce a magnetic field superimposed on the electric field. The four stages of electrostatic octupole elements 11, 12, 13, 14 create an electric field superimposed on the electric field created by the four stages of electrostatic quadrupole elements 1–4.

In an actual instrument, four stages of dipole elements and four stages of hexapole elements are also mounted to produce fields superimposed on the fields created by the aforementioned quadrupole and octupole elements. The dipole elements act as deflecting devices for axial alignment. The hexapole elements act to correct the second-order aperture aberration. Since these dipole and hexapole elements are not closely related to the present invention, they will not be described in detail below.

In this configuration, a beam of charged particles is entered from the left side as viewed in the figure. The four stages of electrostatic quadrupole elements 1–4 and the objective lens 7 together act to form a reference orbit for the beam. As a result, the beam is focused onto a specimen surface 20. In FIG. 1, both orbit $R_x$ of the particle beam in the X-direction and orbit $R_y$ in the Y-direction are schematically drawn on the same plane.

The reference orbit can be regarded as a paraxial orbit, that is, an orbit assumed where there is no aberration. The quadrupole element 1 causes the Y-direction orbit $R_y$ to pass through the center of the quadrupole element 2. The quadrupole element 2 causes the X-direction orbit $R_x$ to pass through the center of the quadrupole element 3. Finally, the quadrupole elements 3, 4 and objective lens 7 together focus the beam onto the specimen surface. In practice, these components need to be adjusted mutually for complete focusing. At this time, the four stages of dipole elements are used for axial alignment.

Referring more particularly to FIG. 1, the charged-particle beam in the X-direction orbit $R_x$ is diverged by the quadrupole element 1 acting like a concave lens. Then, the beam is converged by the quadrupole element 2 acting like a convex lens. The beam is thus made to pass through the center of the quadrupole element 3. Then, the beam is converged by the quadrupole element 4 and travels toward the objective lens 7. On the other hand, the charged-particle beam in the Y-direction orbit $R_y$ is converged by the quadrupole element 1 and made to pass through the center of the quadrupole element 2. Then, the beam is converged by the quadrupole element 3. Finally, the beam is diverged by the quadrupole element 4 and moves toward the objective lens 7. In this way, the function of a single concave lens is created by combining the divergent action of the quadrupole element 1 acting on the X-direction orbit $R_x$ and the divergent action of the quadrupole element 4 acting on the Y-direction orbit $R_y$.

Correction of chromatic aberration using the aberration corrector C is described. To correct chromatic aberration by the system shown in FIG. 1, the potential $\phi_{q2}$ [V] at the electrostatic quadrupole element 2 and the magnetic excitation $J_2$ [AT] (or magnetic potential) of the magnetic quadrupole element 5 are adjusted such that the reference orbit is not affected. The whole lens system acts to correct the X-direction chromatic aberration to zero. Similarly, the potential $\phi_{q3}$ [V] at the electrostatic quadrupole element 3 and the magnetic excitation $J_3$ [AT] of the magnetic quadrupole element 6 are adjusted such that the reference orbit is not affected. The whole lens system acts to correct the Y-direction chromatic aberration to zero.

Correction of spherical aberration (correction of the third-order aperture aberration) is next described. Where spherical aberration is corrected, X- and Y-direction chromatic aberrations are corrected. Then, the X-direction spherical aberration in the whole lens system is corrected to zero by the potential $\phi_{02}$ [V] at the electrostatic octupole element 12. The Y-direction spherical aberration is corrected to zero by the potential $\phi_{03}$ [V] at the electrostatic octupole element 13. Then, the spherical aberration in the resultant direction of the X- and Y-directions is corrected to zero by the electrostatic octupole elements 11 and 14. In practice, repeated mutual adjustments are necessary. Superimposition of the potentials and magnetic excitations at the quadrupole and octupole elements has been put into practical use by varying the potential or excitation applied to each pole of a single twelve-pole element by using this twelve-pole element to synthesize dipoles, quadrupoles, hexapoles, octupoles, etc. This method has been introduced, for example, in [4] M. Haider et al., *Optik* 63, No. 1, 9–23 (1982).

Figure 9:
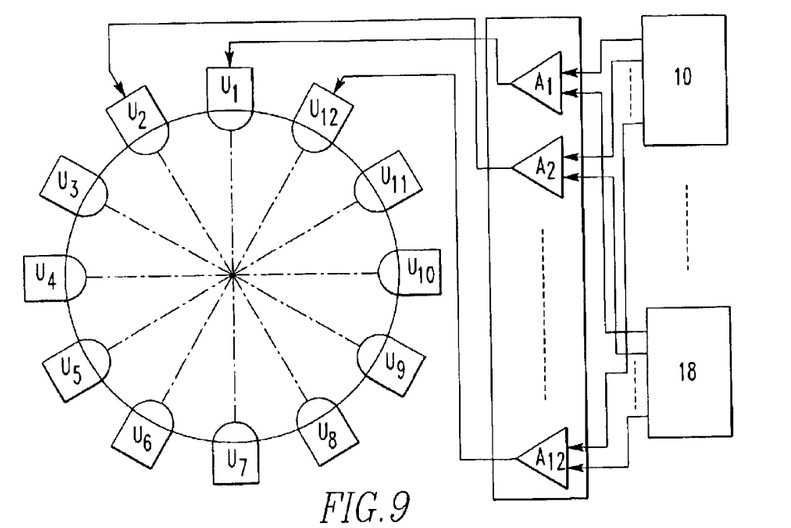
FIG. 9 is a diagram illustrating a method of using an electrostatic twelve-pole element as an electrostatic multipole element having less than twelve poles.

In particular, in an electrostatic design, a final stage of power supplies $A_n$ (n=1, 2, . . . , 12) capable of supplying a voltage to twelve electrodes $U_n$ (n=1, 2, . . . , 12) independently is connected as shown in FIG. 9. Where a quadrupole field is produced, output voltages from a quadrupole power supply 10 are supplied to the final-stage power supplies $A_n$ to obtain a quadrupole field close to an ideal quadrupole field. If it is assumed that the output voltages from the final-stage power supplies $A_n$ are proportional to the output voltages from the quadrupole power supply 10, the ratio of the output voltages from the power supply 10 assumes a value as given in the reference [4] above. Where an octupole field is created to be superimposed on this quadrupole field, output voltages from an octupole power supply 18 are added to the output voltages from the quadrupole power supply 10 and supplied to the final-stage power supplies $A_n$ to obtain a field close to an ideal octupole field. Similarly, a field on which a multipole field produced by a 2n-pole element (n=1, 2, . . . , 6) is superimposed is obtained using the single twelve-pole element.

Figure 10:
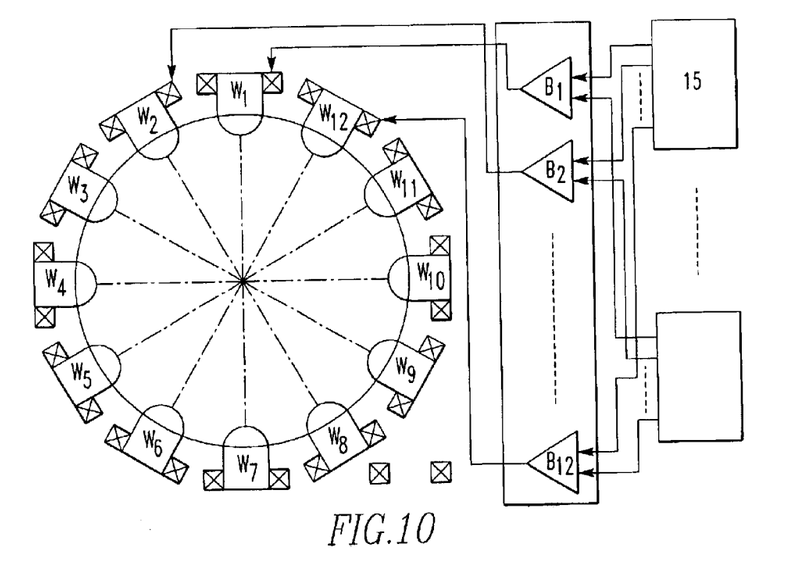
FIG. 10 is a diagram illustrating a method of using an electromagnetic twelve-pole element as an electromagnetic multipole element having less than twelve poles.

In a magnetic design, a final stage of power supplies $B_n$ (n=1, 2, . . . , 12) capable of supplying excitation currents to the coils on twelve magnets $W_n$ (n=1, 2, . . . , 12) independently is connected as shown in FIG. 10. Where a quadrupole magnetic field is created, output voltages from a quadrupole magnetic-field power supply 15 are supplied to the final stage of power supplies $B_n$ to produce a field close to an ideal quadrupole magnetic field. If it is assumed that the output currents from the final-stage power supplies $B_n$ are proportional to the output voltage from the quadrupole magnetic-field power supply 15, the ratio of the output voltages from the power supply 15 assumes a magnetic exciting ratio as given in the reference [4] above. Superimposition of multipole fields other than a quadrupole magnetic field is not explained herein. However, multipole fields other than a quadrupole magnetic field can be superimposed in the same way as in the electrostatic design, by adding voltages for multipole fields to the input voltage to the final-stage power supplies $B_n$. A yoke for magnetically connecting the outside portions of the magnets $W_n$ is omitted in FIG. 10.

Where electrostatic and magnetic designs are superimposed, a conductive magnetic material may be used so that the magnets $W_n$ can act also as the electrodes $U_n$. In this case, the coils on the magnets are mounted so as to be electrically isolated from the electrodes.

In the description given below, the 2n-pole elements are treated as if they were superimposed on top of each other to simplify the explanation. In practice, superimposition of multipole fields on a single twelve-pole field is achieved by adding voltage signals as mentioned previously.

After the end of chromatic aberration, it may be necessary to correct the second-order aperture aberration by means of four stages of hexapole elements before correction of spherical aberration is performed. This correction is made in the same procedure as in the aforementioned correction of spherical aberration. This second-order aperture aberration occurs depending on the mechanical accuracy of the aberration corrector. Normally, the amount of correction is small, and this aberration affects higher-order aberrations only a little within the scope of the present invention. The second-order aperture aberration is corrected within the aberration corrector. If the resultant magnification (described later) of the aberration corrector and the objective lens is varied, higher-order aberrations are affected little, though the resultant magnification is important in the present invention. Therefore, description of the correction of the second-order aperture aberration is omitted herein.

Figure 2A:
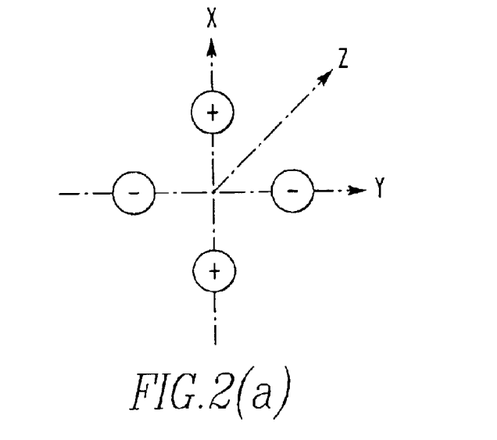
Figure 2B:
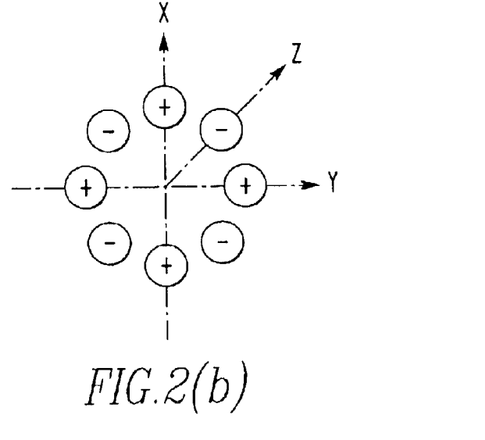

Potential or voltage $\phi$ used in the following description regarding electrostatic multipole elements indicates a positive value of the multipole elements arranged normally as shown in FIGS. 2(*a*) and 2(*b*). Similarly, magnetic excitation J [AT] of the magnetic type indicates magnetic excitation on the positive side.

The manner in which the angular aperture of the probe striking the specimen surface 20 is next described. After at least one of chromatic and spherical aberrations is corrected as mentioned previously, it is necessary to make appropriate the angular aperture $\alpha_f$ of the probe striking the specimen to minimize the effects of other factors (e.g., the brightness of the electron gun located ahead of the objective aperture 8 of FIG. 1, the aberration in the condenser lens system left uncorrected because the operating conditions are modified after completion of correction, diffraction aberration, and the fourth- and higher-order aberrations). In the past, an objective aperture using an aperture plate having plural apertures of different diameters is placed before or behind an aberration corrector, and the operator selects apertures of appropriate diameters to vary the angular aperture $\alpha_f$ in increments to seek an optimum value.

The aforementioned theory of aberration correction and experimental results are superb. However, an obstacle to commercialization is that there is no means for optimizing the angular aperture $\alpha_f$ of the probe striking the specimen at all times if any one or more of various operating parameters, including accelerating voltage, working distance, and probe current, are modified after chromatic or spherical aberration is corrected. Where the angular aperture is adjusted, the only one available method consists of placing an objective aperture having selectable aperture diameters as mentioned previously before or behind the aberration corrector and adjusting the angular aperture in increments.

With this instrument, the angular aperture can be optimized only under certain conditions, if the aforementioned operating parameters are modified. Therefore, it has been impossible to constantly adjust the angular aperture in such a way that the probe diameter is reduced to a minimum or a desired or maximum depth of focus is achieved, in spite of the effort to correct aberrations.

Where the conventional angular aperture control lens normally inserted between the system of condenser lenses and the objective lens is placed between an aberration corrector and the objective lens intact, if the angular aperture is adjusted after aberration correction, the magnification of the lens system is varied thereby. This upsets the conditions for achieving aberration correction. Hence, this method cannot be used for the control of the angular aperture in the original sense of the phrase.

Furthermore, with the aberration corrector designed to maintain constant the excitation of magnetic quadrupole elements for correcting chromatic aberration to prevent the magnetic field from drifting if the operating parameters including the accelerating voltage are changed, the angular aperture varies when the operating parameters are changed as described above. Therefore, it is necessary to reset the angular aperture to its optimum value.

SUMMARY OF THE INVENTION

It is an object of the present invention to provide particle beam apparatus which is equipped with an aberration corrector and capable of controlling the angular aperture of the beam after aberrations have been corrected.

According to a first embodiment of the present invention, a charged-particle beam apparatus equipped with an aberration corrector comprises: the aberration corrector being placed within an optical path of a charged-particle beam and acting to correct chromatic aberration, the aberration corrector consisting of four stages of electrostatic quadrupole elements, a first power supply for supplying voltages to the four stages of electrostatic quadrupole elements, two stages of magnetic quadrupole elements for superimposing a magnetic potential distribution on the electric potential distribution created by the two central electrostatic quadrupole elements, and a second power supply for exciting the two stages of magnetic quadrupole elements; a system of condenser lenses mounted upstream of the aberration corrector and acting to adjust the probe current; a third power supply for the system of condenser lenses; an angular aperture control device placed between the system of condenser lenses and the aberration corrector, the angular aperture control device consisting of at least one angular aperture control lens and a fourth power supply for the angular aperture control lens, the angular aperture control device acting to control the angular aperture of a probe striking a specimen; an objective lens mounted downstream of the aberration corrector and acting to focus the probe onto the specimen; a fifth power supply for the objective lens; an objective aperture placed at least downstream of the system of condenser lenses; a manual operation portion permitting one to modify an operating parameter such as the accelerating voltage on the charged-particle beam, the working distance between the objective lens and the specimen, and the probe current; and a controller for controlling the first through fifth power supplies according to a manual operation or setting performed on the manual operation portion. When at least one of the accelerating voltage, working distance, and probe current is modified, the angular aperture of the probe is so controlled as to minimize the diameter of the probe striking the specimen.

According to a second embodiment of the present invention, a charged-particle beam apparatus equipped with an aberration corrector comprises: the aberration corrector being placed within an optical path of the charged-particle beam and acting to correct chromatic aberration, the aberration corrector consisting of four stages of electrostatic quadrupole elements, a first power supply for supplying voltages to the four stages of electrostatic quadrupole elements, two stages of magnetic quadrupole elements for superimposing a magnetic potential distribution on an electric potential distribution created by the two central electrostatic quadrupole elements, and a second power supply for exciting the two stages of magnetic quadrupole elements; a system of condenser lenses mounted upstream of the aberration corrector and acting to adjust a probe current; a third power supply for the system of condenser lenses; an angular aperture control device placed between the system of condenser lenses and the aberration corrector, the angular aperture control device consisting of at least two angular aperture control lenses and a fourth power supply for the angular aperture control lenses, the angular aperture control device acting to control the angular aperture of the probe striking the specimen without changing focal conditions of the aberration corrector or conditions under which aberrations are corrected; an objective lens mounted downstream of the aberration corrector and acting to focus the probe onto the specimen; a fifth power supply for the objective lens; an objective lens aperture placed at least downstream of the system of condenser lenses; a manual operation portion permitting one to modify an operating parameter, such as the accelerating voltage on the charged-particle beam, the working distance between the objective lens and the specimen, and the probe current; and a controller for controlling the first through fifth power supplies according to a manual operation or setting performed on the manual operation portion. When at least one of the accelerating voltage, working distance, and probe current is modified, the angular aperture of the probe is so controlled as to minimize the diameter of the probe striking the specimen.

A charged-particle beam apparatus equipped with an aberration corrector is based on the charged-particle beam apparatus of the above-described second embodiment and characterized in that the angular aperture control device is so controlled that the position of an object plane of the aberration corrector for the charged-particle beam is fixed.

A charged-particle beam apparatus equipped with an aberration corrector is based on any one of the above-described embodiments and characterized in that the controller has first arithmetic means for finding values with which the power supplies of the aberration corrector and the power supply for the objective lens are controlled when the angular aperture of the probe striking the specimen is set to a desired value, second arithmetic means for finding the diameter of the probe or the depth of focus from the angular aperture and aberrations determined by the angular aperture, and third arithmetic means for finding a value of the angular aperture at which the diameter of the probe striking the specimen is reduced to a minimum or a desired or maximum depth of focus is produced. The controller sets the angular aperture of the probe to such a value as to minimize the diameter of the angular aperture or to produce a desired or maximum depth of focus.

A charged-particle beam apparatus equipped with an aberration corrector as described above is based on the charged-particle beam apparatus and characterized in that the controller has storage means and previously finds, using the above-described plural arithmetic means, plural combinations of various values of accelerating voltage, working distance, and probe current at which the probe diameter is minimized or a desired or maximum depth of focus is produced, stores the combinations in the storage means, and can read the combinations from the storage means as the need arises.

According to a third embodiment of the present embodiment, a charged-particle beam apparatus equipped with an aberration corrector comprises: the aberration corrector being placed within an optical path of a charged-particle beam and acting to correct chromatic aberration, the aberration corrector consisting of four stages of electrostatic quadrupole elements, a first power supply for supplying voltages to the four stages of electrostatic quadrupole elements, two stages of magnetic quadrupole elements for superimposing a magnetic potential distribution on the electric potential distribution created by the two central electrostatic quadrupole elements, and a second power supply for exciting the two stages of magnetic quadrupole elements; a system of condenser lenses mounted upstream of the aberration corrector and acting to adjust the probe current; a third power supply for the system of condenser lenses; an angular aperture control device placed between the system of condenser lenses and the aberration corrector, the angular aperture control device consisting of at least one angular aperture control lens and a fourth power supply for the angular aperture control lens, the angular aperture control device acting to control the angular aperture of a probe striking a specimen; an objective lens assembly mounted downstream of the aberration corrector and acting to focus the probe onto the specimen, the objective lens assembly consisting of at least two lenses; a fifth power supply capable of controlling the resultant magnification of the at least two lenses of the objective lens assembly to set the amount of correction made to aberration in the probe striking the specimen to a desired value; an objective aperture placed at least downstream of the system of condenser lenses; a manual operation portion permitting one to modify an operating parameter, such as the accelerating voltage on the charged-particle beam, the working distance between the objective lens and the specimen, and the probe current; and a controller for controlling the first through fifth power supplies according to a manual operation or setting performed on the manual operation portion. When at least one of the accelerating voltage, working distance, and probe current is modified, the angular aperture of the probe is so controlled as to minimize the diameter of the probe striking the specimen.

A charged-particle beam apparatus equipped with an aberration corrector is based on the charged-particle beam apparatus of the third embodiment and characterized in that the fifth power supply for the objective lens assembly varies the resultant magnification without changing the focal conditions of the aberration corrector or conditions under which aberrations are corrected to thereby adjust the amount of correction made to aberration in the probe, and that the angular aperture control device corrects variations in the angular aperture of the probe caused when the resultant magnification is varied.

According to a fourth embodiment, a charged-particle beam apparatus equipped with an aberration corrector comprises: the aberration corrector being placed within an optical path of a charged-particle beam and acting to correct chromatic aberration, the aberration corrector consisting of four stages of electrostatic quadrupole elements, a first power supply for supplying voltages to the four stages of electrostatic quadrupole elements, two stages of magnetic quadrupole elements for superimposing a magnetic potential distribution on the electric potential distribution created by the two central electrostatic quadrupole elements, and a second power supply for exciting the two stages of magnetic quadrupole elements; a system of condenser lenses mounted upstream of the aberration corrector and acting to adjust the probe current; a third power supply for the system of condenser lenses; an angular aperture control device placed between the system of condenser lenses and the aberration corrector, the angular aperture control device consisting of at least two angular aperture control lenses and a fourth power supply for the angular aperture control lenses, the angular aperture control device acting to control the angular aperture of the probe striking the specimen without changing focal conditions of the aberration corrector or conditions under which aberrations are corrected; an objective lens assembly mounted downstream of the aberration corrector and acting to focus the probe onto the specimen, the objective lens assembly consisting of at least two lenses; a fifth power supply capable of controlling the resultant magnification of the at least two lenses of the objective lens assembly to set the amount of correction made to aberration in the probe striking the specimen to a desired value; an objective aperture placed at least downstream of the system of condenser lenses; a manual operation portion permitting one to modify an operating parameter, such as the accelerating voltage on the charged-particle beam, the working distance between the objective lens and the specimen, and the probe current; and a controller for controlling the first through fifth power supplies according to a manual operation or setting performed on the manual operation portion. When at least one of the accelerating voltage, working distance, and probe current is modified, the angular aperture of the probe is so controlled as to minimize the diameter of the probe striking the specimen.

A charged-particle beam apparatus equipped with an aberration corrector is based on the charged-particle beam apparatus having a fifth power supply for the objective lens assembly and characterized in that the fifth power supply for the objective lens assembly varies the resultant magnification without changing the focal conditions of the aberration corrector or conditions under which aberrations are corrected to thereby adjust the amount of correction made to aberration in the probe, and that the angular aperture control device corrects variations in the angular aperture of the probe caused when the resultant magnification is varied and is so controlled that the position of an object plane of the aberration corrector for the charged-particle beam is fixed.

A charged-particle beam apparatus equipped with an aberration corrector is based on the charged-particle beam apparatus of the third and fourth embodiments and variations thereof characterized in that the controller has first arithmetic means for finding values with which the power supplies of the aberration corrector and the power supply for the objective lenses are controlled when the angular aperture of the probe striking the specimen is set to a desired value, second arithmetic means for finding the diameter of the probe or the depth of focus from the angular aperture and aberrations determined by the angular aperture, and third arithmetic means for finding a value of the angular aperture at which the diameter of the probe striking the specimen is reduced to a minimum or a desired or maximum depth of focus is produced. The controller sets the angular aperture of the probe to such a value as to minimize the diameter of the angular aperture or to produce a desired or maximum depth of focus.

A charged-particle beam apparatus equipped with an aberration corrector is based on the charged-particle beam apparatus of the previous embodiment and characterized in that the controller has storage means and previously finds, using the above-described plural arithmetic means, plural combinations of various values of accelerating voltage, working distance, and probe current at which the probe diameter is minimized or a desired or maximum depth of focus is produced, stores the combinations in the storage means, and can read the combinations from the storage means as the need arises.

A charged-particle beam apparatus equipped with an aberration corrector is based on the charged-particle beam apparatus of any above-described embodiment and characterized in that the aberration corrector has four stages of electrostatic octupole elements for superimposing an octupole potential onto the potential distribution created by the four stages of electrostatic quadrupole elements and an octupole power supply for supplying voltages to the four stages of electrostatic octupole elements. The controller has a function of controlling this octupole power supply.

Other objects and features of the invention will appear in the course of the description thereof, which follows.

BRIEF DESCRIPTION OF THE DRAWINGS

FIGS. 2(*a*) and 2(*b*) are diagrams illustrating a quadrupole element and an octupole element;

DESCRIPTION OF THE PREFERRED EMBODIMENTS

Figure 3:
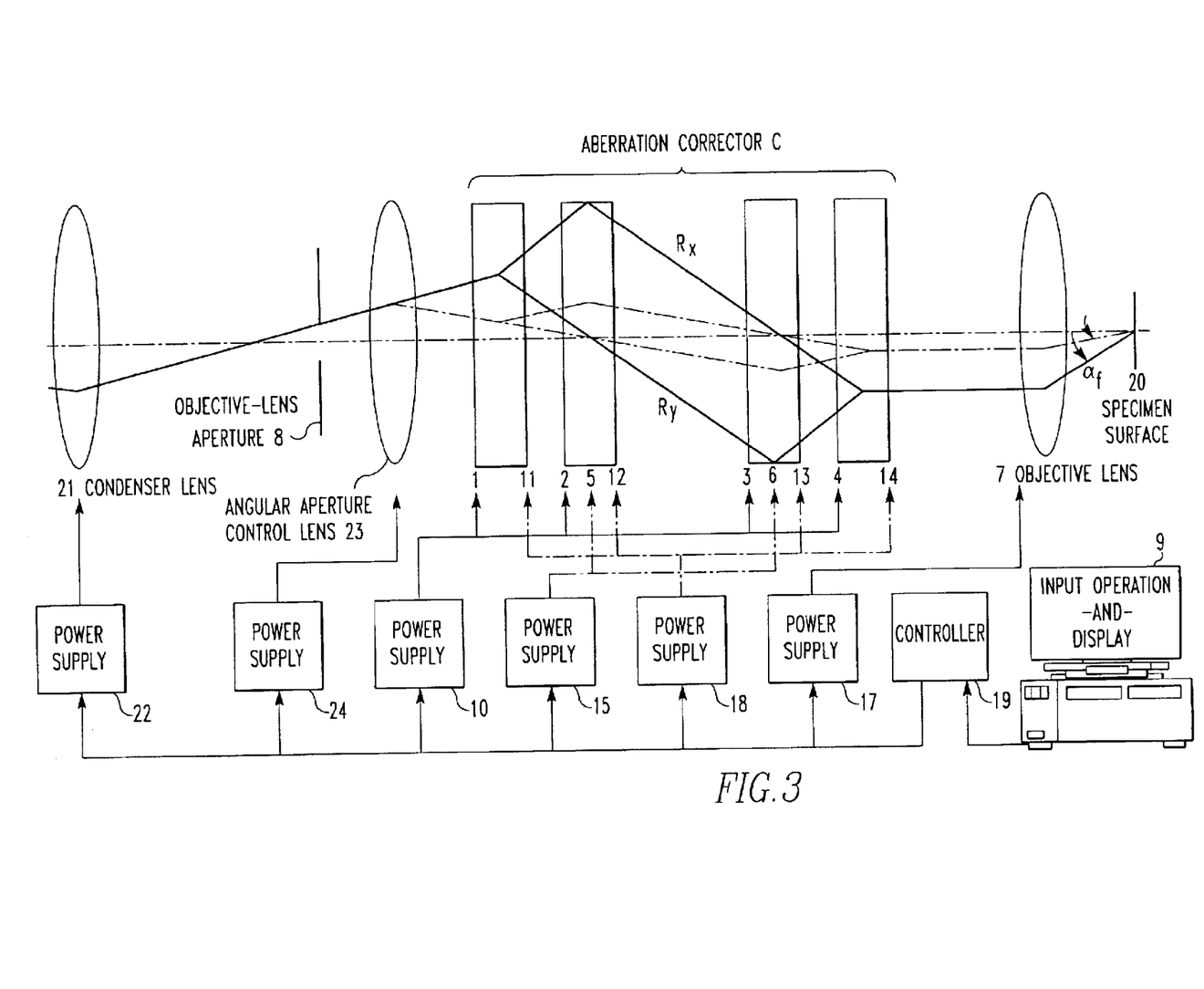
FIG. 3 is a diagram showing the fundamental structure of apparatus according to one embodiment of the present invention.

The preferred embodiments of the present invention are hereinafter described in detail with reference to the accompanying drawings. FIG. 3 shows the fundamental structure of apparatus according to the present invention, the apparatus being designed to direct a charged-particle beam probe at a specimen. It is to be noted that like components are indicated by like reference numerals in various figures including FIG. 1 already referenced.

In FIG. 3, an aberration corrector C is mounted in the optical system. To correct chromatic aberration, the corrector is composed of four stages of quadrupole elements 1, 2, 3, 4 and two stages of magnetic quadrupole elements 5, 6 for superimposing a magnetic potential distribution analogous to the electric potential distribution created by the two central stages of electrostatic quadrupole elements 2 and 3 on this electric potential distribution. To correct spherical aberration, the corrector further includes four stages of electrostatic octupole elements 11, 12, 13, and 14 for superimposing an octupole potential on the potential distribution created by the four stages of electrostatic quadrupole elements 1–4. Depending on the purpose or specifications of the scanning electron microscope incorporating the aberration corrector C, the four stages of electrostatic octupole elements for correcting spherical aberration may be omitted.

An objective lens 7 is located downstream of the aberration corrector C. An objective-lens aperture 8 is mounted upstream of the corrector C. A manual input operation-and-display 9 is used to modify the accelerating voltage or working distance between the objective lens 7 and the specimen 20. A power supply 10 supplies voltages to the four stages of electrostatic quadrupole elements 1–4. Another power supply 15 is mounted to excite two stages of magnetic quadrupole elements 5 and 6. A further power supply 17 is mounted to excite the objective lens 7. Still another power supply 18 is mounted to supply voltages to the four stages of electrostatic octupole elements 11, 12, 13, and 14.

In addition to the structure described above, there is provided a controller 19 for controlling the power supplies 10 and 15 according to the manual input operation or setting performed on the manual input operation-and-display 9. This controller 19 also controls the power supply 18 according to a manual input operation or setting performed on the manual input operation-and-display 9. The controller 19 may comprise a digital computer with an arithmetic capability.

A system of condenser lenses 21 is mounted upstream of the objective aperture 8 to adjust the probe current using this aperture. The system of condenser lenses 21 is excited with a power supply 22 that is under control of the controller 19. An angular aperture control lens 23 is positioned to control the angular aperture $\alpha_f$ of the probe incident on the specimen surface 20 by the use of the objective aperture 8. This control lens 23 is excited with a power supply 24 that is under control of the controller 19.

Figure 8:
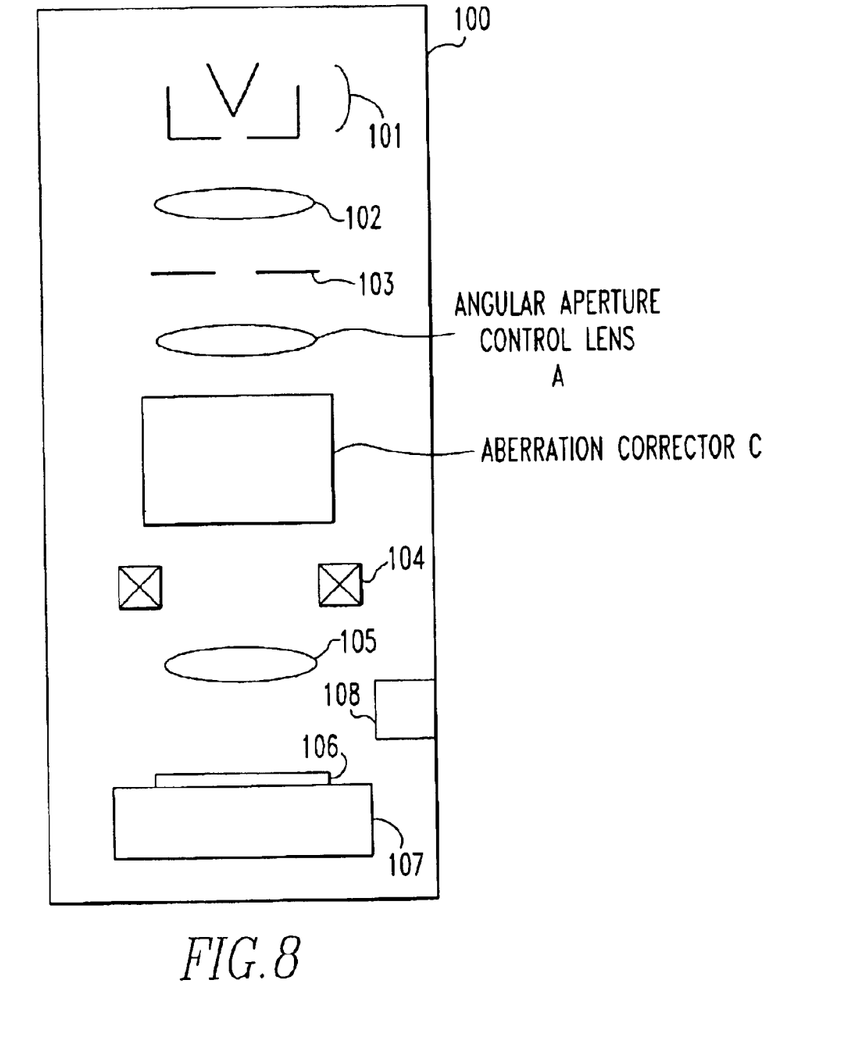
FIG. 8 is a diagram showing a scanning electron microscope incorporating an aberration corrector C and an angular aperture control lens A.

This aberration corrector C is incorporated in a scanning electron microscope or the like as shown in FIG. 8. This microscope has a microscope column 100 whose inside is kept in a vacuum environment. Various components are mounted inside the microscope column 100. An electron gun 101 is mounted to produce an electron beam and impart energy to electrons by an accelerating voltage. A system of condenser lenses 102 is also mounted to control the electron beam produced by the electron gun 101, thus setting the probe current and probe diameter. An objective-lens aperture 103 cooperates with the system of condenser lenses 102 to limit the probe current to an appropriate value. Also incorporated are an angular aperture control lens A and the aforementioned aberration corrector C. A deflector 104 deflects the beam in two dimensions to make a scan. An objective lens 105 focuses the electron beam onto a specimen 106 carried on a specimen stage 107. This stage 107 can be driven at will so that any desired location on the specimen 106 can be hit and scanned with the electron beam. A detector 108 detects a signal, such as secondary electrons, emanating from the specimen 106 when it is scanned with the beam. The components ranging from the electron gun 101 to the objective lens 105 may be referred to as the optics for the electron beam. Where a decelerating potential relative to the electron beam is applied to the specimen 106 via the specimen stage 107, the components ranging from the electron gun 101 to the specimen 106 may be referred to as the optics for the electron beam.

The present invention is characterized in that the controller 19 performs the following processing to correct aberration more stably and set the angular aperture $\alpha_f$ optimally when the operator varies the accelerating voltage $V_a$, working distance WD, or probe current $I_p$ through the manual input operation-and-display 9.

The manner in which the angular aperture is controlled optimally when chromatic or spherical aberration in the objective lens is not corrected is described, for example, in Japanese Patent Publication Nos. 01-159943 (1989) and 01-236563 (1989). Therefore, a method of controlling the angular aperture optimally after both chromatic and spherical aberrations have been corrected is described herein using geometrical optics. For the sake of simplicity, it is assumed that the aberration coefficient is almost identical between X- and Y-directions and that the X-direction angle $\alpha_{Xf}$ of the particle probe hitting the specimen surface is comparable to the Y-direction angle $\alpha_{Yf}$. Consequently, there is no distinction between the X- and Y-directions in the following description.

Let $V_a$ be the accelerating voltage. Let $q \cdot V_a$ be the energy of a particle hitting the specimen (where q is the electric charge of the charged particle). Let $\lambda$ be the wavelength of the particle beam determined by the accelerating voltage $V_a$ and by the mass m of the particle. Let $I_p$ be the probe current. Let $\beta_r(V_a, \alpha_f)$ be the brightness of the source of the charged-particle beam, the brightness affecting aberrations when the conditions under which the charged-particle beam source, system of condenser lenses, and angular aperture control lens are operated are modified. Where the aberration corrector and aberrations up to the fifth order in the objective lens are taken into consideration, probe diameters limited by the various factors are respectively given by:

$$d_{\beta r} = \left(\frac{2}{\pi}\right) \cdot \left(\frac{I_p}{\beta_r}\right)^{1/2} \cdot \alpha_f^{-1} \quad (1\text{-}1)$$

$$d_\lambda = \frac{1.22\lambda}{\alpha} \quad (1\text{-}2)$$

$$d_{Cc2} = C_{c2} \cdot \alpha_f \cdot \left(\frac{\Delta V}{V_a}\right)^2 \quad (1\text{-}3)$$

$$d_{C3c} = \left(\frac{1}{2}\right) \cdot C_{3c} \cdot \alpha_f^3 \cdot \left(\frac{\Delta V}{V_a}\right) \quad (1\text{-}4)$$

$$d_{C5} = \left(\frac{2}{3}\right) \cdot C_5 \cdot \alpha_f^5 \quad (1\text{-}5)$$

$$d_{Cc4} = C_{c4} \cdot \alpha_f \cdot \left(\frac{\Delta V}{V_a}\right)^4 \quad (1\text{-}6)$$

Eq. (1—1) indicates limitation imposed by the brightness. Eq. (1–2) indicates limitation imposed by diffraction aberration and is known as the diameter of the first dark ring of the Airy disk. Eq. (1–3) indicates limitation imposed by second-order chromatic aberration. Eq. (1–4) indicates limitation imposed by third-order aperture and chromatic aberration. Eq. (1–5) indicates limitation imposed by fifth-order aperture aberration. These Eqs. (1–4) and (1–5) form a least confusion disk. Eq. (1–6) indicates limitation imposed by fourth-order chromatic aberration. The resultant probe diameter $d_p$ is given by:

$$d_p = (d_{\beta r}^2 + d_\lambda^2 + d_{Cc2}^2 + d_{C3c}^3 + d_{c5}^2 + d_{Cc4}^2)^{1/2} \quad (2)$$

For the sake of simplicity of illustration, the probe diameter $d_p$ has been found using geometrical optics. It can be found more accurately using wave optics as described in the above-cited paper [2].

Frequently, the effects of the second-order chromatic aberration $d_{Cc2}$ of Eq. (1–3) including $(\Delta V/V_a)^2$ and the fourth-order chromatic aberration of Eq. (1–6) including $(\Delta V/V_a)^4$ on the probe diameter $d_p$ are smaller than the other terms, although the effects depend on the conditions. From these equations, an optimum angular aperture $\alpha_{OPT}$ that minimizes the probe diameter is found from $\alpha_f$ that is given by:

$$\frac{\partial d_p}{\partial \alpha_f} = 0 \quad (3)$$

The above equation indicates the case in which the probe diameter $d_p$ assumes its local minimum value. In practical applications, however, there is a different concept. In particular, let $m_{OBS}$ be the magnification of the final image actually observed by a human. Let $\delta_e$ be the width of allowable blur corresponding to the resolution of the human eye. The depth of focus 2L (i.e., ±L) is given by:

$$L = \frac{\frac{\delta_e}{m_{OBS}} - k \cdot d_p}{2\alpha_f} \quad (4)$$

where $d_p$ is the diameter of the probe and k is a coefficient satisfying the relation 0<k<1. Generally, in an equation used for estimation, the coefficient is often set equal to unity (k=1). Where the magnification of the final image $m_{OBS}$ is relatively low, the product $k \cdot d_p$ can be sufficiently neglected in comparison with the quotient ($\delta_e/m_{OBS}$). Therefore, desired depth of focus 2L can be obtained by appropriately modifying the angular aperture $\alpha_L$. If the magnification $m_{OBS}$ is increased and the product $k \cdot d_p$ can no longer be neglected in comparison to the quotient ($\delta_e/m_{OBS}$), the depth of focus assumes its maximum value at some angular aperture $\alpha_L$. At this time, the optimum angular aperture $\alpha_L$ giving a maximum depth of focus is given by:

$$\frac{\partial L}{\partial \alpha_f} = 0 \quad (5)$$

If the magnification is increased further, the angular aperture $\alpha_L$ satisfying Eq. (5) becomes approximately equal to the optimum angular aperture $\alpha_{OPT}$ satisfying Eq. (3).

Accordingly, if the accelerating voltage $V_a$, working distance WD, and probe current $I_p$ are given and the reference orbit is determined, aberration coefficients $$C_{c2}, C_{3c}, C_5, \text{ and } C_{c4} \quad (6)$$

around the reference orbit are determined. Therefore, the optimum angular aperture is determined from $\alpha_f = \alpha_{OPT}$ or the equation for finding $\alpha_L$. Preferably, the operator can determine according to the purpose whether the angular aperture is $\alpha_{OPT}$ at which the diameter takes its local minimum value or $\alpha_L$ giving a desired or maximum depth of focus.

When the focal distance of the angular aperture control lens 23 is varied to give this optimum angular aperture (e.g., when the angular aperture is varied from a large aperture as indicated by the solid lines in FIG. 3 to a small aperture as indicated by the broken lines), the reference orbit also varies. Therefore, as $\alpha_L$ varies, the effective brightness $\beta_r$ of the electron gun also varies. Furthermore, it is necessary to vary the focal distance of the first stage of quadrupole element of the aberration corrector relatively greatly in order to satisfy the focal conditions. This in turn varies the conditions under which chromatic and spherical aberrations are corrected. Consequently, there is a possibility that some problems take place. For example, the above-described aberration coefficients vary after aberration correction.

In this case, the controller 19 again substitutes the aberration coefficients obtained after the reference orbit has been changed into $\alpha_f = \alpha_{OPT}$ or the equation for finding $\alpha_L$. Calculations are repetitively performed until the probe diameter $d_p$ is reduced to a minimum or convergence into a desired or maximum depth of focus 2L is achieved.

In actual instrumentation, main combinations of the given values of accelerating voltage $V_a$, working distance WD, and probe current $I_p$ are given. The optimum angular aperture $\alpha_f$ is previously calculated at these combinations. The controller 19 sets the value of the optimum angular aperture $\alpha_f$ at the first run. This eliminates repetitive computation or minimizes the amount of computation required until the target angular aperture $\alpha_f$ is obtained.

When the operator sets or modifies at least one of the accelerating voltage $V_a$, working distance WD, and probe current $I_p$ through the manual input operation-and-display 9, this display 9 instructs the controller 19 to set the optimum angular aperture $\alpha_f = \alpha_{OPT}$ or $\alpha_L$ calculated under the above conditions or calculate an optimum angular aperture from the angular aperture previously calculated under conditions closest to the above conditions and set this optimum angular aperture. The method of setting the aperture is implemented as follows.

The size of the angular aperture $\alpha_f$ of the probe hitting the specimen surface corresponds to the spread of the beam on the principal plane of the first stage of electrostatic quadrupole element in the aberration corrector. Accordingly, where a large angular aperture is obtained, the angular aperture control lens 23 is so controlled as to increase the diameter of the beam on the principal plane of the electrostatic quadrupole element 1 as indicated by the solid line in FIG. 3. Where a small angular aperture is derived, the angular aperture control lens 23 is so controlled as to reduce the diameter of the beam on the principal plane of the electrostatic quadrupole element 1.

Then, the controller 19 controls the angular aperture control lens power supply 24 and the quadrupole power supply 10 (in addition, the objective lens power supply 17 if necessary) to satisfy the focal conditions in the above-described state. In this way, the focal distances of the control lens 23 and electrostatic quadrupole elements 1–4 (in addition, the objective lens 7 if necessary) are controlled.

Where it is necessary to modify the conditions under which chromatic aberration is corrected, the manual input operation-and-display 9 instructs the controller 19 to control the quadrupole power supplies 10 and 15 so that chromatic aberration is corrected by the electrostatic quadrupole elements 2–3 and magnetic quadrupole elements 5–6 without changing the reference orbit. Where the conditions under which spherical aberration is corrected need to be modified, the manual input operation-and-display 9 instructs the controller 19 to control the octupole power supply 18, thus correcting spherical aberration.

Figure 4:
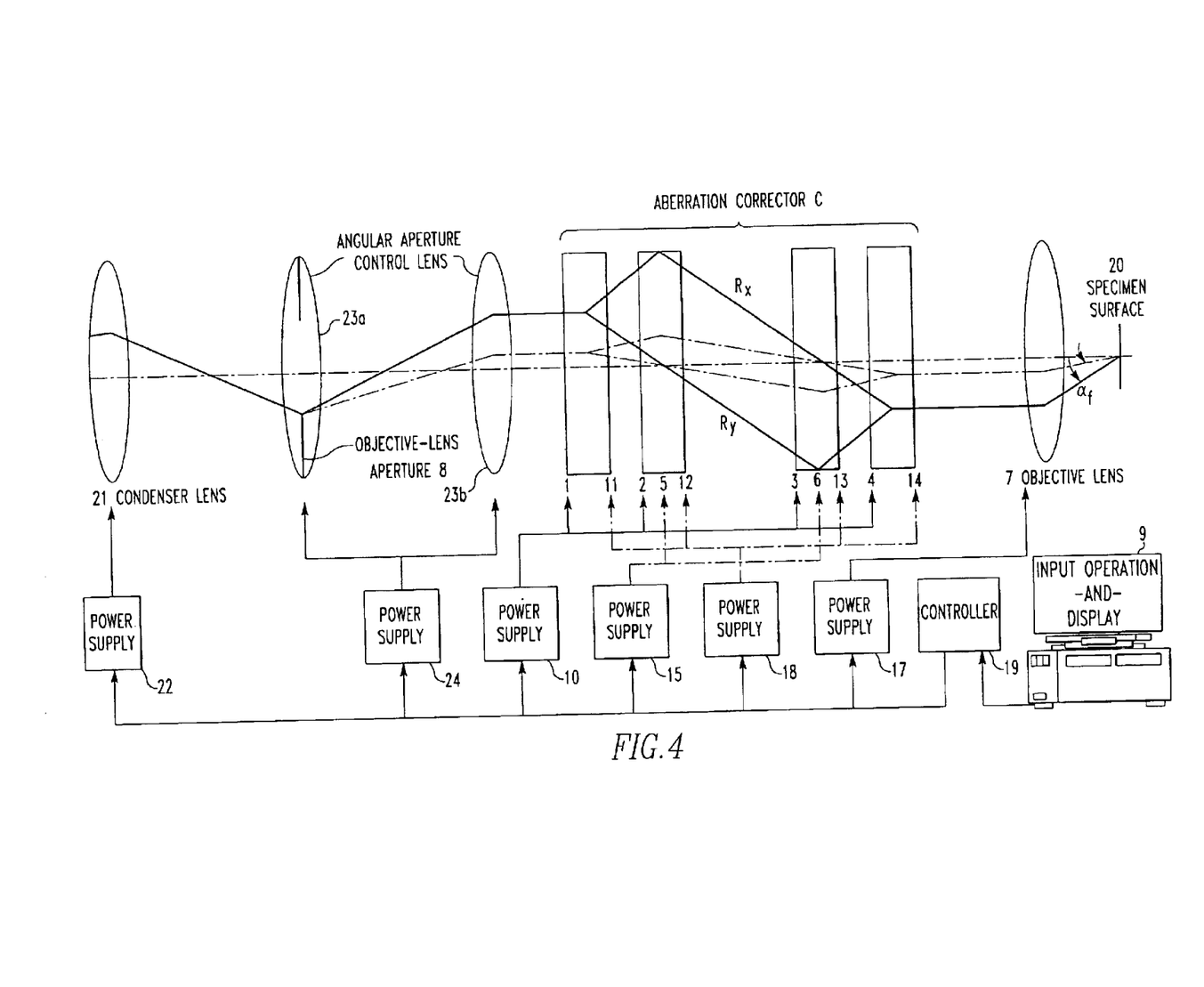
FIG. 4 is a diagram showing the fundamental structure of apparatus according to another embodiment of the present invention.

In the above embodiment, the focal conditions of the aberration corrector are altered when the angular aperture is adjusted. A second, similar angular aperture control lens may be added to mount two angular aperture control lenses in total. The angular aperture may be adjusted using these two lenses to maintain constant the focal conditions of the aberration corrector. A typical example is illustrated in FIG. 4, where the objective aperture 8 is placed close to the position of the principal plane of the first angular aperture control lens 23*a*. The angular aperture is adjusted without varying the probe current $I_p$ by varying the focal distance of the control lens 23*a*.

Then, the second angular aperture control lens 23*b* is placed behind the first control lens 23*a*. The angular aperture is adjusted by adjusting the focal distance of the second control lens 23*b*. The position of the object plane (object point) relative to the electrostatic quadrupole element 1 of the aberration corrector is kept fixed, if the image plane of the first control lens 23*a* is varied due to adjustment of the angular aperture. The angular aperture control lenses 23*a* and 23*b* are connected with the angular aperture control lens power supply 24.

When the operator sets or modifies at least one of the accelerating voltage $V_a$, working distance WD, and probe current $I_p$ through the manual input operation-and-display 9, the aforementioned focusing operation, correction of chromatic aberration, or correction of spherical aberration is performed according to the need and in response to the set values or the degree of modification.

A case in which an instruction is given from the manual input operation-and-display 9 to the controller 19 to correct chromatic and spherical aberrations at the same time is described. Under these conditions, calculated optimum angular aperture $\alpha_f = \alpha_{OPT}$ or $\alpha_L$ is set. Alternatively, an optimum angular aperture is found from the angular aperture previously calculated under conditions closest to the above conditions, and this optimum angular aperture is set. The method of setting the aperture is implemented as follows.

The size of the angular aperture $\alpha_f$ of the probe hitting the specimen surface corresponds to the spread of the beam on the principal plane of the second angular aperture control lens 23*b*. This spread can be adjusted by varying the position of the image plane of the first angular aperture control lens 23*a* as shown in FIG. 4. For example, where a large angular aperture is obtained, the angular aperture control lens 23*a* is so controlled that the diameter of the beam on the principal plane of the lens 23*b* increases, the beam describing an orbit as indicated by the solid line in FIG. 4. Where a small angular aperture is derived, the angular aperture control lens 23 is so controlled as to reduce the diameter of the beam of the quadrupole element 1 on the principal plane. The radius of the beam is the distance between the optical axis and the broken line.

To prevent the position of the object plane of the electrostatic quadrupole element 1 of the aberration corrector or the position of the object point (in the embodiment of FIG. 4, the position=$-\infty$) of the second angular aperture control lens 23*b* from moving regardless of the radius of the beam on the principal plane of the second control lens 23*b* (i.e., regardless of the position of the image plane of the lens 23*a*), the controller 19 modifies the focal distance of the second control lens 23*b*.

As such, only the angular aperture can be adjusted at will without modifying the focal conditions of the aberration corrector at all. Where variations in aberrations in the angular aperture control lenses 23*a* and 23*b* can be neglected when the angular aperture is adjusted, only the angular aperture can be adjusted at will without modifying the conditions under which chromatic or spherical aberration is corrected, as well as the focal conditions of the aberration corrector.

Under this condition, if it is necessary to change the conditions under which chromatic aberration is corrected, the manual input operation-and-display 9 instructs the controller 19 to control the quadrupole power supply 10 and magnetic quadrupole power supply 15, correcting chromatic aberration by means of the electrostatic quadrupole elements 2–3 and magnetic quadrupole elements 5–6 without varying the reference orbit.

Where it is necessary to modify the conditions under which spherical aberration is corrected, the manual input operation-and-control 9 instructs the controller 19 to control the octupole power supply 18, correcting spherical aberration.

Figure 5:
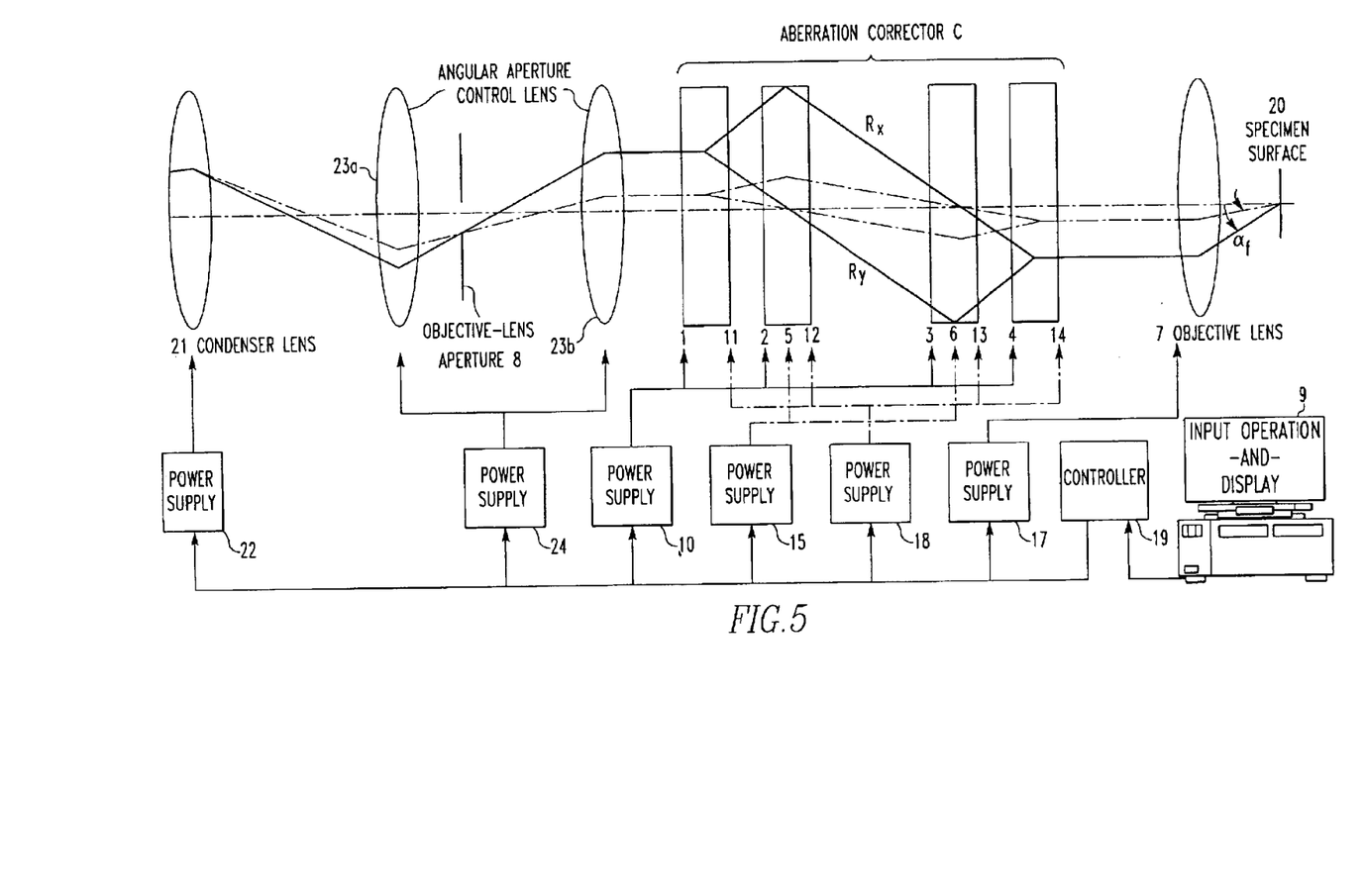
FIG. 5 is a diagram showing the fundamental structure of apparatus according to a further embodiment of the present invention.

In the embodiment illustrated in FIG. 4, the objective aperture 8 is placed close to the position of the principal plane of the angular aperture control lens 23*a*. Obviously, the objective aperture is not always required to exist close to the position of the principal plane. As shown in FIG. 5, the objective aperture 8 may be placed between the angular aperture control lenses 23*a* and 23*b*. In the case of the embodiment illustrated in FIG. 4, the beam diameter on the principal plane of the corresponding angular aperture control lens 23*a* is equal to that of the objective aperture when the angular aperture is adjusted. In this configuration, the beam diameter on the principal plane of the angular control lens 23*a* becomes different when the angular aperture is adjusted as shown in FIG. 5.

When the operator sets or modifies at least one of the accelerating voltage $V_a$, working distance WD, and probe current $I_p$ through the manual input operation-and-display 9, the aforementioned focusing operation, correction of chromatic aberration, or correction of spherical aberration is performed according to the need and in response to the set values or the degree of modification in the same way as in the embodiment previously illustrated in connection with FIG. 4. The optimum angular aperture $\alpha_{OPT}$ or $\alpha_L$ is calculated.

The beam diameter on the principal plane of the angular aperture control lens 23b corresponding to this optimum angular aperture is the same as described in the above embodiment. Since the objective aperture 8 is located between the angular aperture control lenses 23a and 23b, the beam diameter on the principal plane of the angular aperture control lens 23a is different between the case where the angular aperture is large as indicated by the solid line and the case where the angular aperture is small as indicated by the broken line. Accordingly, the focal distance of the system of condenser lenses 21 is varied to prevent the probe current from shifting from the set value when the angular aperture is controlled.

In consequence, when an operating parameter is modified, the angular aperture can be set at will and optimally without changing the focal conditions of the aberration corrector or the conditions under which aberrations are corrected.

In the first through third embodiments already described in connection with FIGS. 3–5, the beam emerging and entering the aberration corrector is shown to be parallel to the optical axis for the sake of simplicity of illustration. Obviously, the beam is not required to be parallel as long as desired optical conditions are satisfied.

It is obvious that in the optical system, such as a system of condenser lenses other than the aberration corrector C, the angular aperture can be adjusted, as long as desired optical conditions are satisfied, irrespective of whether there is a crossover of the beam, even if the crossover is formed between lenses or removed.

In the description of the above embodiments, each aperture in the objective aperture has a constant diameter. These apertures may have different diameters and selectively used. This objective lens having these selectable apertures and an angular aperture control lens may be combined and controlled. Furthermore, in the above embodiments, to simplify the problems, the manner in which the angular aperture is controlled ($\alpha_j = \alpha_{OPT}$) to produce a desired or maximum depth of focus when the magnification of the final image $m_{OBS}$ that is one operating parameter is changed is omitted. As can be understood from the description of the embodiments, this control can be implemented without problems by the configuration of the first through third embodiments, because the angular aperture can be adjusted at will without changing the probe current.

Figure 6:
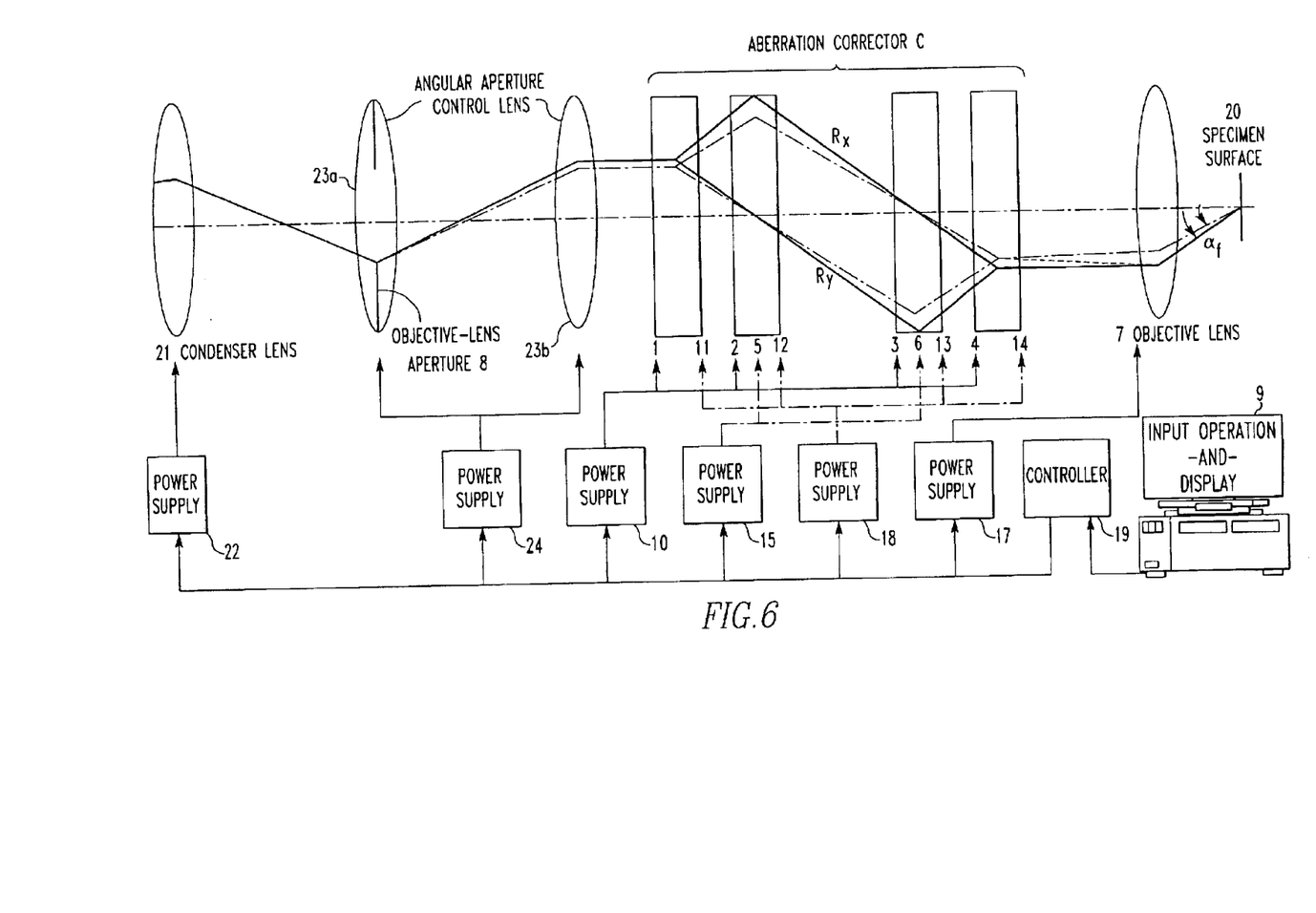
FIG. 6 is a diagram showing the apparatus equipped with the angular aperture control lenses 23*a* and 23*b* to illustrate the relation between the modified angular aperture and the resultant magnification $M_4 \cdot M_{OL}$.

Another specific embodiment of the present invention is next described. Our research has shown that the amount of correction made to the aberration in a specimen 20 can be increased and decreased without changing the conditions under which chromatic aberration is corrected by the aberration corrector C, by varying the resultant magnification $M_4 \cdot M_{OL}$ of the magnification $M_4$ of the fourth stage of electrostatic quadrupole element 4 of the aberration corrector C and the magnification $M_{OL}$ of the objective lens 7. FIG. 6 illustrates the operation of the apparatus to which the angular aperture control lenses 23a and 23b are added.

In particular, FIG. 6 illustrates an embodiment in which the modified angular aperture is returned to the original state when the focal distance of the fourth stage (final stage) of electrostatic quadrupole element of the aberration corrector C is varied. The focal distance of the fourth stage of electrostatic quadrupole element 1 that is not yet modified is indicated by the broken line. To change the resultant magnification $M_4 \cdot M_{OL}$ of the magnification $M_4$ of the fourth stage of electrostatic quadrupole element 4 of the aberration corrector C and the magnification $M_{OL}$ of the objective lens 7, it is assumed that the focal distance of the electrostatic quadrupole element 4 and the focal distance of the objective lens have been changed as indicated by the double-dot-dash line in FIG. 6.

Under this condition, the resultant magnification $M_4 \cdot M_{OL}$ will vary and so the angular aperture of the particle probe striking the specimen surface will also vary as indicated by the double-dot-dash line. In the embodiment of FIG. 6, the angular aperture decreases. The radius of the beam incident on the first stage of electrostatic quadrupole element is adjusted by adjusting the angular aperture control lenses 23a and 23b. In the embodiment of FIG. 6, the radius of the beam is increased to increase the angular aperture. The original angular aperture can be regained by obtaining a state as indicated by the solid line.

It can be seen from this embodiment that the angular aperture can be set greater or smaller than the original angular aperture according to the need. Therefore, if the angular aperture control lenses 23a and 23b are added, the amount of correction made to aberration can be increased and reduced without changing the conditions under which chromatic aberration is corrected by the aberration corrector C, by varying the resultant magnification $M_4 \cdot M_{OL}$ of the magnification $M_4$ of the electrostatic quadrupole element 4 and the magnification $M_{OL}$ of the objective lens 7.

A modification of the above-described specific embodiment is next described. Our research has revealed that the amount of correction made to aberration in the specimen 20 can be increased and reduced without changing the operating conditions of the aberration corrector C, by adding a lens 27 auxiliary to the objective lens between the fourth stage of electrostatic quadrupole element 4 of the aberration corrector C and the objective lens 7 and varying the resultant magnification $M_A \cdot M_{OL}$ of the magnification $M_A$ of the additional lens 27 and the magnification $M_{OL}$ of the objective lens 7.

Figure 7:
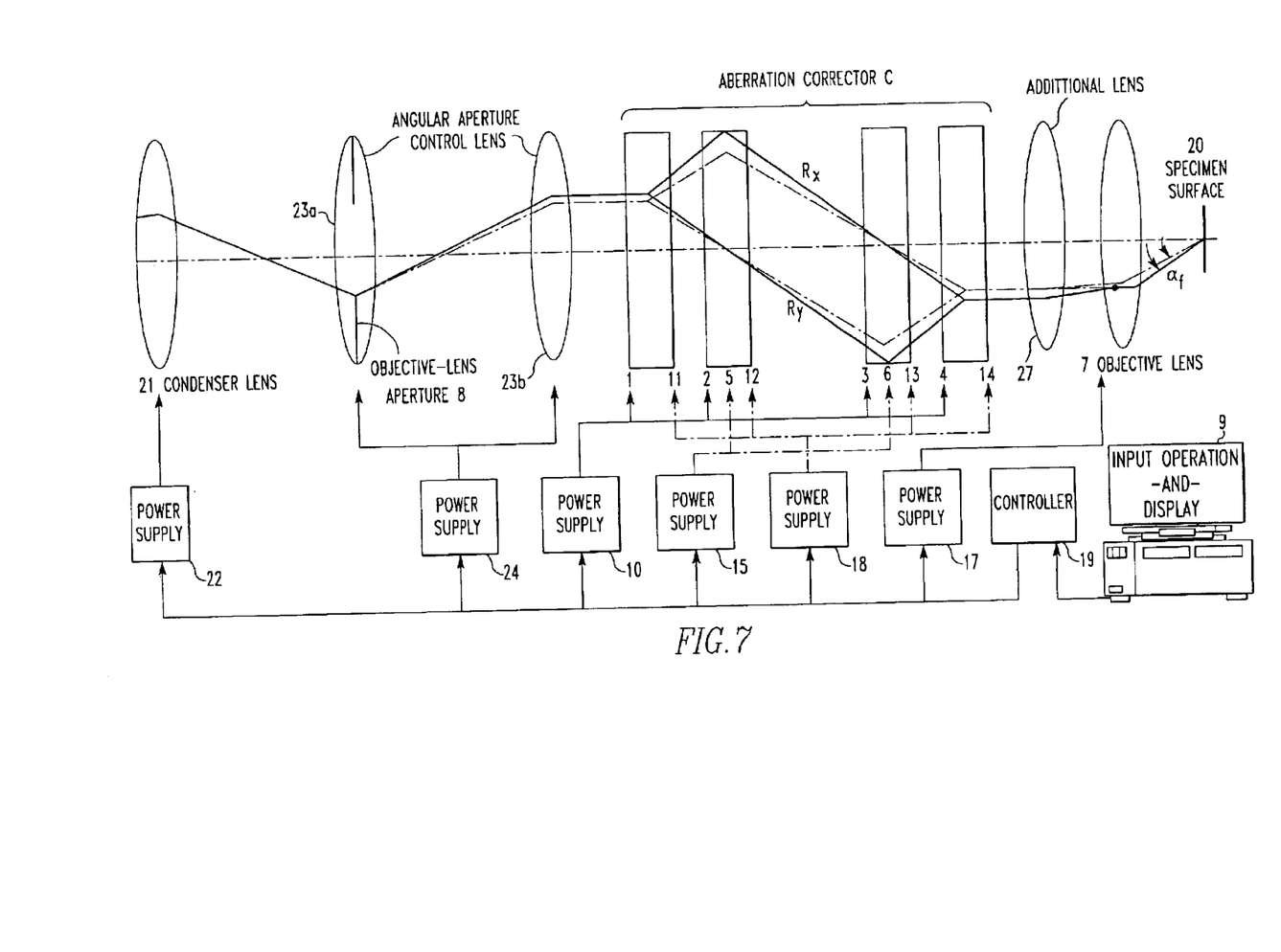
FIG. 7 is a diagram showing the fundamental structure of apparatus according to still another embodiment of the present invention.

FIG. 7 is a diagram illustrating the operation of the apparatus to which the angular aperture control lenses 23a and 23b are added. Specifically, the additional lens 27 is positioned between the fourth stage (final stage) of electrostatic quadrupole element 4 of the aberration corrector C and the objective lens 7. When the focal distance is modified, the varied angular aperture is restored to its original state. The state in which the focal distance of the additional lens 27 is not yet modified is indicated by the broken line. It is assumed that the focal distance of the additional lens 27 and the focal distance of the objective lens are modified under this condition as indicated by the double-dot-dash line in FIG. 7 to change the resultant magnification $M_A \cdot M_{OL}$ of the magnification $M_A$ of the additional lens 27 and the magnification $M_{OL}$ of the objective lens 7.

If this condition is maintained, the resultant magnification $M_A \cdot M_{OL}$ will vary and so the angular aperture of the particle probe striking the specimen surface will also vary as indicated by the double-dot-dash line. In the embodiment of FIG. 7, the angular aperture decreases. The radius of the beam incident on the first stage of electrostatic quadrupole element is adjusted (in the embodiment of FIG. 7, the radius of the beam is increased to increase the angular aperture) by adjusting the angular aperture control lenses 23a and 23b, and the original state is regained by obtaining the state indicated by the solid line. It can be seen from this embodiment that an angular aperture that is greater or smaller than the original angular aperture can be established according to the need. In the embodiment of FIG. 7, the angular aperture can be modified without changing the conditions under which aberration is corrected by the aberration corrector C or the focal conditions, if the resultant magnification $M_A \cdot M_{OL}$ is varied. Therefore, the operational controllability is improved. For example, in the method of varying the resultant magnification $M_4 \cdot M_{OL}$ by making use of the fourth stage of electrostatic quadrupole element 4 of the aberration corrector C as already described in connection with FIG. 6, the magnification in the X-direction and the magnification in the Y-direction may vary. In the embodiment of FIG. 7, this can be prevented even if the angular aperture is varied.

More specifically, even where angular aperture control lenses 23a and 23b are added, as well as the additional lens 27, the amount of correction made to aberration can be increased and reduced without varying the operating conditions of the aberration corrector C, by varying the resultant magnification $M_A \cdot M_{OL}$ of the magnification $M_A$ of the additional lens 27 and the magnification $M_{OL}$ of the objective lens 7.

As described thus far, an angular aperture control device is positioned between an aberration corrector and a system of condenser lenses, the corrector acting to correct at least one of chromatic and spherical aberrations. When at least one of accelerating voltage, working distance, and probe current is modified, the angular aperture of the probe is also controlled. Therefore, the probe diameter can be set to its minimum value where these operating parameters are changed.

In another feature of the present invention, an angular aperture control device is positioned between an aberration corrector and a system of condenser lenses, the corrector acting to correct at least one of chromatic and spherical aberrations. When at least one of the accelerating voltage, working distance, probe current, and magnification of the final image is modified, the angular aperture of the probe is also controlled. Consequently, the depth of focus of the probe can be set to a desired or maximum value in response to variations in these operating parameters.

In a further feature of the present invention, an angular aperture control device having at least two lenses is positioned between an aberration corrector and a system of condenser lenses, the corrector acting to correct at least one of chromatic and spherical aberrations. The apparatus is so designed that the angular aperture of the probe incident on the specimen can be controlled without changing the focal conditions of the aberration corrector or the conditions under which aberration is corrected. As a consequence, the operator can freely select an angular aperture that minimizes the probe diameter or makes the depth of focus assume a desired or maximum value in response to variations in the operating parameters.

In an apparatus according to another embodiment of the present invention, a lens is added between the corrector and the objective lens, when at least one of the accelerating voltage, working distance, probe current, and magnification of the final image is modified, the angular aperture of the probe incident on the specimen is controlled without modifying the focal conditions of the aberration corrector. In consequence, the operator can freely select an angular aperture that minimizes the probe diameter or makes the depth of focus assume a desired or maximum value in response to variations in the operating parameters.

Having thus described our invention with the detail and particularity required by the Patent Laws, what is desired protected by Letters Patent is set forth in the following claims.

What is claimed is:

1. Charged-particle beam apparatus equipped with an aberration corrector and adapted to direct a charged-particle beam probe at a specimen, said charged-particle beam apparatus comprising:

said aberration corrector placed within an optical path of the charged-particle beam and acting to correct chromatic aberration, said aberration corrector consisting of four stages of electrostatic quadrupole elements, a first power supply for supplying voltages to the four stages of electrostatic quadrupole elements, two stages of magnetic quadrupole elements for superimposing a magnetic potential distribution on an electric potential distribution created by the two central electrostatic quadrupole elements, and a second power supply for exciting the two stages of magnetic quadrupole elements;

a system of condenser lenses mounted upstream of said aberration corrector and acting to adjust probe current;

a third power supply for said system of condenser lenses;

an angular aperture control device placed between said system of condenser lenses and said aberration corrector, said angular aperture control device consisting of at least one angular aperture control lens and a fourth power supply for said angular aperture control lens, said angular aperture control device acting to control the angular aperture of the probe striking the specimen;

an objective lens mounted downstream of said aberration corrector and acting to focus said probe onto the specimen;

a fifth power supply for said objective lens;

an objective lens aperture placed at least downstream of said system of condenser lenses;

a manual input operation device permitting one to modify one of the operating parameters selected from the accelerating voltage on the charged-particle beam, the working distance between the objective lens and the specimen, and the probe current; and a controller for controlling the first through fifth power supplies in response to a manual input operation performed on said manual input operation device, such that when at least one of the accelerating voltage, working distance, and probe current is modified, the angular aperture of the probe is so controlled as to minimize the diameter of the probe striking the specimen.

2. Charged-particle beam apparatus equipped with an aberration corrector and adapted to direct a charged-particle beam probe at a specimen, said charged-particle beam apparatus comprising:

said aberration corrector placed within an optical path of the charged-particle beam and acting to correct chromatic aberration, said aberration corrector consisting of four stages of electrostatic quadrupole elements, a first power supply for supplying voltages to the four stages of electrostatic quadrupole elements, two stages of magnetic quadrupole elements for superimposing a magnetic potential distribution on an electric potential distribution created by the two central electrostatic quadrupole elements, and a second power supply for exciting the two stages of magnetic quadrupole elements;

a system of condenser lenses mounted upstream of said aberration corrector and acting to adjust probe current;

a third power supply for said system of condenser lenses;

an angular aperture control device placed between said system of condenser lenses and said aberration corrector, said angular aperture control device consisting of at least two angular aperture control lenses and a fourth power supply for said angular aperture control lenses, said angular aperture control device acting to control the angular aperture of the probe striking the specimen without changing focal conditions of said aberration corrector or conditions under which aberrations are corrected;

an objective lens mounted downstream of said aberration corrector and acting to focus said probe onto the specimen;

a fifth power supply for said objective lens;

an objective lens aperture placed at least downstream of said system of condenser lenses;

a manual input operation device permitting one to modify one of the operating parameters selected from the accelerating voltage on the charged-particle beam, the working distance between the objective lens and the specimen, and the probe current; and a controller for controlling the first through fifth power supplies in response to a manual input operation performed on said manual input operation device, such that when at least one of the accelerating voltage, working distance, and probe current is modified, the angular aperture of the probe is so controlled as to minimize the diameter of the probe striking the specimen.

3. The charged-particle beam apparatus of claim 2, wherein said angular aperture control device is so controlled that the position of an object plane of said aberration corrector for said charged-particle beam is fixed.

4. The charged-particle beam apparatus of any one of claims 1 to 3, wherein said controller has first arithmetic means for finding values with which said first and second power supplies for said aberration corrector and said fifth power supply for said objective lens are controlled when the angular aperture of the probe striking the specimen is set to a desired value, second arithmetic means for finding one of the diameter of the probe and the depth of focus from the angular aperture and various aberrations determined by the angular aperture, and third arithmetic means for finding a value of said angular aperture at which the diameter of the probe striking the specimen is reduced to a minimum or a desired or maximum depth of focus is produced, and wherein said controller sets the angular aperture of the probe to such a value as to minimize the diameter of the probe or to make the depth of focus assume a desired or maximum value.

5. The charged-particle beam apparatus of claim 4, wherein said controller has storage means and previously finds, using the above-described plural arithmetic means, plural combinations of various values of accelerating voltage, working distance, probe current, and probe angular aperture at which the probe diameter is minimized or a desired or maximum depth of focus is produced, stores the combinations in a storage means, and can read the combinations from the storage means as the need arises.

6. Charged-particle beam apparatus equipped with an aberration corrector and adapted to direct a charged-particle beam probe at a specimen, said charged-particle beam apparatus comprising:

said aberration corrector placed within an optical path of the charged-particle beam and acting to correct chromatic aberration, said aberration corrector consisting of four stages of electrostatic quadrupole elements, a first power supply for supplying voltages to the four stages of electrostatic quadrupole elements, two stages of magnetic quadrupole elements for superimposing a magnetic potential distribution on an electric potential distribution created by the two central electrostatic quadrupole elements, and a second power supply for exciting the two stages of magnetic quadrupole elements;

a system of condenser lenses mounted upstream of said aberration corrector and acting to adjust probe current;

a third power supply for said system of condenser lenses;

an angular aperture control device placed between said system of condenser lenses and said aberration corrector, said angular aperture control device consisting of at least one angular aperture control lens and a fourth power supply for said angular aperture control lens, said angular aperture control device acting to control the angular aperture of the probe striking the specimen;

an objective lens assembly mounted downstream of said aberration corrector and acting to focus the probe onto the specimen, said objective lens assembly consisting of at least two lenses;

a fifth power supply for said objective lenses capable of controlling the resultant magnification of said at least two lenses to set the amount of correction made to aberration in the probe striking the specimen to a desired value;

an objective lens aperture placed at least downstream of said system of condenser lenses;

a manual input operation device permitting one to modify one of the operating parameters selected from the accelerating voltage on the charged-particle beam, the working distance between the objective lens and the specimen, and the probe current; and a controller for controlling the first through fifth power supplies in response to a manual input operation performed on the manual input operation device, such that when at least one of the accelerating voltage, working distance, and probe current is modified, the angular aperture of the probe is so controlled as to minimize the diameter of the probe striking the specimen.

7. The charged-particle beam apparatus of claim 6, wherein said fifth power supply for the objective lenses varies said resultant magnification without changing focal conditions of said aberration corrector or conditions under which aberration is corrected to thereby adjust the amount of correction made to aberration in the probe, and wherein said angular aperture control device corrects variations in the angular aperture of the probe caused when said resultant magnification is varied.

8. Charged-particle beam apparatus equipped with an aberration corrector and adapted to direct a charged-particle beam probe at a specimen, said charged-particle beam apparatus comprising:

said aberration corrector placed within an optical path of the charged-particle beam and acting to correct chromatic aberration, said aberration corrector consisting of four stages of electrostatic quadrupole elements, a first power supply for supplying voltages to the four stages of electrostatic quadrupole elements, two stages of magnetic quadrupole elements for superimposing a magnetic potential distribution on an electric potential distribution created by the two central electrostatic quadrupole elements, and a second power supply for exciting the two stages of magnetic quadrupole elements;

a system of condenser lenses mounted upstream of said aberration corrector and acting to adjust probe current;

a third power supply for said system of condenser lenses;

an angular aperture control device placed between said system of condenser lenses and said aberration corrector, said angular aperture control device consisting of at least two angular aperture control lenses and a fourth power supply for said angular aperture control lenses, said angular aperture control device acting to control the angular aperture of the probe striking the specimen without changing focal conditions of said aberration corrector or conditions under which aberrations are corrected;

an objective lens assembly mounted downstream of said aberration corrector and acting to focus the probe onto the specimen, said objective lens assembly consisting of at least two lenses;

a fifth power supply for said objective lenses capable of controlling the resultant magnification of said at least two lenses to set the amount of correction made to aberration in the probe striking the specimen to a desired value;

an objective lens aperture placed at least downstream of said system of condenser lenses;

a manual input operation device permitting one to modify one of the operating parameters selected from the accelerating voltage on the charged-particle beam, the working distance between the objective lens and the specimen, and the probe current; and a controller for controlling the first through fifth power supplies in response to a manual input operation performed on the manual input operation device such that when at least one of the accelerating voltage, working distance, and probe current is modified, the angular aperture of the probe is so controlled as to minimize the diameter of the probe striking the specimen.

9. The charged-particle beam apparatus of claim 8, wherein said fifth power supply for the objective lenses varies said resultant magnification without changing focal conditions of said aberration corrector or conditions under which aberration is corrected to thereby adjust the amount of correction made to aberration in the probe, and wherein said angular aperture control device corrects variations in the angular aperture of the probe caused when said resultant magnification is varied and is so controlled that the position of an object plane of said aberration corrector for said charged-particle beam is fixed.

10. The charged-particle beam apparatus of any one of claims 6 to 9, wherein said controller has first arithmetic means for finding values with which said first and second power supplies for said aberration corrector and said fifth power supply for said objective lenses are controlled when the angular aperture of the probe striking the specimen is set to a desired value, second arithmetic means for finding one of the diameter of the probe and the depth of focus from the angular aperture and various aberrations determined by the angular aperture, and third arithmetic means for finding a value of said angular aperture at which the diameter of the probe striking the specimen is reduced to a minimum or a desired or maximum depth of focus is produced, and wherein said controller sets the angular aperture of the probe to such a value as to minimize the diameter of the angular aperture or to make the depth of focus assume a desired or maximum value.

11. The charged-particle beam apparatus of claim 10, wherein said controller has storage means and previously finds, using the above-described plural arithmetic means, plural combinations of various values of accelerating voltage, working distance, probe current, and probe angular aperture at which the probe diameter is minimized or a desired or maximum depth of focus is produced, stores the combinations in the storage means, and can read the combinations from the storage means as the need arises.

12. The charged-particle beam apparatus of any one of claims 1 to 3 and 6 to 9, wherein said aberration corrector has four stages of electrostatic octupole elements for superimposing an octupole potential onto the potential distribution created by the four stages of electrostatic quadrupole elements and an octupole power supply for supplying voltages to the four stages of electrostatic octupole elements, wherein said controller has a function of controlling said octupole power supply, whereby at least one of chromatic and spherical aberrations can be corrected.

* * * * *